US011802989B2

(12) United States Patent
Hamam et al.

(10) Patent No.: US 11,802,989 B2
(45) Date of Patent: Oct. 31, 2023

(54) SYSTEMS AND METHODS FOR GENERATING VERTICAL AND LATERAL HETEROGENEITY INDICES OF RESERVOIRS

(71) Applicant: Saudi Arabian Oil Company, Dhahran (SA)

(72) Inventors: Hassan Hasan Hamam, Khobar (SA); Waqas Ahmed Khan, Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 229 days.

(21) Appl. No.: 17/097,379

(22) Filed: Nov. 13, 2020

(65) Prior Publication Data

US 2021/0349238 A1 Nov. 11, 2021

Related U.S. Application Data

(60) Provisional application No. 63/022,855, filed on May 11, 2020.

(51) Int. Cl.
*G01V 99/00* (2009.01)
*E21B 47/047* (2012.01)
*G06F 30/20* (2020.01)

(52) U.S. Cl.
CPC .......... *G01V 99/005* (2013.01); *E21B 47/047* (2020.05); *G06F 30/20* (2020.01)

(58) Field of Classification Search
CPC ...... G01V 99/005; G06F 30/20; E21B 47/047
(Continued)

(56) References Cited

U.S. PATENT DOCUMENTS 7,478,024 B2 * 1/2009 Gurpinar ................ G06Q 10/06
166/250.16
7,890,264 B2 * 2/2011 Elphick ................... E21B 43/16
702/6
(Continued)

FOREIGN PATENT DOCUMENTS

CN 106703798 A 5/2017

OTHER PUBLICATIONS

Lake et al. ("A Review of Heterogeneity Measures Used in Reservoir Characterization" Marcel Dekker, Inc, 1991, pp. 409-439) (Year: 1991).*
(Continued)

*Primary Examiner* — Iftekhar A Khan
(74) *Attorney, Agent, or Firm* — DINSMORE & SHOHL LLP

(57) ABSTRACT

Methods and systems for generating heterogeneity indices for reservoirs is provided. The method includes generating a geological model based on physical locations of a plurality of wells in a reservoir, wherein the geological model provides: graphical representations corresponding to the physical locations of the plurality of wells, a plurality of pseudo locations of pseudo wells in the reservoir, and graphical representations corresponding to the pseudo locations of the pseudo wells, determining reservoir properties associated with the pseudo locations of the pseudo wells in the reservoir, determining vertical heterogeneity indices associated with each location of the pseudo locations of the pseudo wells in the reservoir, determining using an interpolation operation associated with the vertical heterogeneity indices, lateral heterogeneity indices associated with each pseudo location of the pseudo locations of the pseudo wells, and generating for display a heterogeneity property model based
(Continued)

on the vertical heterogeneity indices and the lateral heterogeneity indices.

17 Claims, 7 Drawing Sheets

(58) Field of Classification Search
USPC .......................................................... 703/6
See application file for complete search history.

(56) References Cited

U.S. PATENT DOCUMENTS

| | | | | |
|---|---|---|---|---|
| 7,894,991 | B2* | 2/2011 | Del Castillo | E21B 43/00 702/14 |
| 8,646,525 | B2* | 2/2014 | Izgec | E21B 43/16 166/268 |
| 2006/0224369 | A1* | 10/2006 | Yang | E21B 43/16 703/10 |
| 2008/0062479 | A1* | 3/2008 | Tsai | H04N 25/134 358/518 |
| 2008/0162093 | A1* | 7/2008 | Nivlet | G01V 1/30 703/2 |
| 2008/0255892 | A1* | 10/2008 | Orangi | G06Q 10/063 705/7.11 |
| 2009/0043507 | A1* | 2/2009 | Dommisse | G01V 1/34 702/6 |
| 2009/0272531 | A1* | 11/2009 | Montaron | E21B 43/16 166/252.1 |
| 2010/0027376 | A1* | 2/2010 | Washbourne | G01V 1/28 367/25 |
| 2010/0161292 | A1* | 6/2010 | Shook | E21B 43/00 703/2 |
| 2010/0299126 | A1* | 11/2010 | Chugunov | G01V 11/00 703/10 |
| 2010/0300682 | A1* | 12/2010 | Thakur | E21B 43/00 166/250.01 |
| 2011/0290479 | A1* | 12/2011 | Izgec | E21B 43/16 166/250.02 |
| 2011/0320182 | A1* | 12/2011 | Dommisse | G01V 1/34 703/10 |
| 2012/0010865 | A1* | 1/2012 | Benson | G01V 11/00 703/10 |
| 2012/0053920 | A1* | 3/2012 | Rai | G01V 9/00 703/10 |
| 2012/0253770 | A1* | 10/2012 | Stern | G06F 30/20 703/10 |
| 2012/0330553 | A1* | 12/2012 | Mollaei | E21B 43/16 702/11 |
| 2013/0110483 | A1* | 5/2013 | Chugunov | G01V 99/005 703/10 |
| 2013/0166262 | A1 | 6/2013 | Shook et al. | |
| 2015/0323701 | A1* | 11/2015 | Mesri | G06F 17/10 703/2 |
| 2016/0003008 | A1* | 1/2016 | Uribe | E21B 43/30 166/250.01 |
| 2016/0047943 | A1* | 2/2016 | Maucec | G01V 99/005 703/2 |
| 2016/0102530 | A1* | 4/2016 | Baranov | E21B 43/30 703/10 |
| 2016/0145991 | A1* | 5/2016 | Yarus | E21B 47/022 700/275 |
| 2017/0051598 | A1* | 2/2017 | Ouenes | G06F 30/20 |
| 2018/0225868 | A1* | 8/2018 | Bize | E21B 25/00 |
| 2019/0025461 | A1* | 1/2019 | Wiener | G01V 99/005 |
| 2019/0271211 | A1* | 9/2019 | Mustapha | E21B 41/0092 |
| 2020/0301036 | A1* | 9/2020 | Ramfjord | G01V 1/50 |
| 2021/0405247 | A1* | 12/2021 | Badri | G01V 11/00 |

OTHER PUBLICATIONS

Aghli et al. (Reservoir heterogeneity and fracture parameter determination using electrical image logs and petrophysical data, 2019, Petroleum Science, pp. 51-69) (Year: 2019).*

Rotimi et al. (Reservoir characterization and modeling of lateral heterogeneity using multivariate analysis, Annual Report, Energy Exploration & Exploitation , 2014 pp. 527-552) (Year: 2014).*

International Search Report and Written Opinion dated Aug. 9, 2021 pertaining to International application No. PCT/US2021/031075 filed May 6, 2021, 18 pages.

Lake, L. W. et al. "A Review of Heterogeneity Measures Used in Reservoir Characterization", In Situ, 15(4), Jan. 1, 1991, pp. 409-439.

Khanfari et al., "An Approach to Correlate the statistical-Based Lorenz Method, as a Way of Measuring Heterogeneity, with Kozeny-Carman Equation, International Journal of Geotechnical and Geological Engineering", vol. 11, No. 9, 2017.

Saudi Authority for Intellectual Property, Notification of Substantive Examination Report dated Apr. 27, 2023 (received May 4, 2023) pertaining to Saudi Arabian Application No. 522441245, pp. 1-11.

* cited by examiner

SYSTEMS AND METHODS FOR GENERATING VERTICAL AND LATERAL HETEROGENEITY INDICES OF RESERVOIRS

CROSS REFERENCE

This application claims priority to U.S. Provisional Application Ser. No. 63/022,855, filed on May 11, 2020.

TECHNICAL FIELD

The present disclosure relates to systems and methods for determining heterogeneity indices, and more specifically, to systems and methods of determining vertical and lateral heterogeneity indices for distinct portions or zones in reservoirs.

BACKGROUND

One of the biggest challenges the oil and gas industry faces today is accurately and efficiently determining heterogeneity indices of reservoirs. Conventional systems of determining heterogeneity indices are time and resource intensive, require significant surveying and analysis of reservoir topologies, and only have the functionality to determine heterogeneity along wellbores and surfaces of areas that currently have wells installed. Conventional systems lack effective tools and techniques for determining heterogeneity indices in reservoirs that do not have any wells installed. Conventional systems also lack the tools and techniques for determining heterogeneity indices of multiple intervals or zones of reservoirs extending in the vertical and lateral directions. Thus, a need exists in the industry for determining vertical and lateral heterogeneity indices for distinct portions or zones in reservoirs.

SUMMARY

In one aspect, a method for generating vertical and lateral heterogeneity indices for reservoirs is provided. The method includes generating, by a computing device, a geological model based on physical locations of a plurality of wells in a reservoir, wherein the geological model provides: graphical representations corresponding to the physical locations of the plurality of wells, pseudo locations of pseudo wells in the reservoir, and representations corresponding to the pseudo locations of the pseudo wells, determining, by the computing device, reservoir properties associated with the pseudo locations of the pseudo wells in the reservoir, determining, by the computing device, vertical heterogeneity indices associated with each location of the pseudo locations of the pseudo wells in the reservoir, determining, by the computing device, using an interpolation operation associated with the vertical heterogeneity indices, lateral heterogeneity indices associated with each of the pseudo locations of the pseudo wells, and generating for display, by the computing device, a heterogeneity property model based on the vertical heterogeneity indices and the lateral heterogeneity indices.

In another aspect, a system for generating vertical and lateral heterogeneity indices for reservoirs is provided. The system includes a processor and a memory component that stores logic that, when executed by the processor, causes the system to perform at least the following: generate a geological model based on physical locations of a plurality of wells in a reservoir, the geological model providing the following: graphical representations corresponding to the physical locations of the plurality of wells; pseudo locations of pseudo wells in the reservoir, and representations corresponding to the pseudo locations of the pseudo wells, determine reservoir properties associated with the pseudo locations of the pseudo wells in the reservoir, determine vertical heterogeneity indices associated with each location of the pseudo locations of the pseudo wells in the reservoir, determine, using an interpolation operation associated with the vertical heterogeneity indices, lateral heterogeneity indices associated with each of the pseudo locations of the pseudo wells, and provide at least a portion of the vertical heterogeneity indices and lateral heterogeneity indices for display.

In yet another aspect, a non-transitory computer-readable medium storing operating instructions is provided. These operating instructions, when executed by one or more processors of a computing device, causes the computing device to: generate a geological model based on physical locations of a plurality of wells in a reservoir, the geological model providing at least one of the following: graphical representations corresponding to the physical locations of the plurality of wells, pseudo locations of pseudo wells in the reservoir, or additional representations corresponding to the pseudo locations of the pseudo wells, determine reservoir properties associated with the pseudo locations of the pseudo wells in the reservoir, determine vertical heterogeneity indices associated with each location of the pseudo locations of the pseudo wells in the reservoir, determine, using an interpolation operation associated with the vertical heterogeneity indices, lateral heterogeneity indices associated with each of the pseudo locations of the pseudo wells, generate a heterogeneity property model based on the vertical heterogeneity indices and the lateral heterogeneity indices, and provide at least one of the following for display: at least one of the vertical heterogeneity indices or at least one of the lateral heterogeneity indices.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION OF THE DISCLOSURE

Embodiments of the present disclosure are directed to systems and methods for determining heterogeneity indices associated with various portions of reservoirs. Specifically, these embodiments aid in the determination of the extent to which the composition of a reservoir varies, e.g., with a change in depth (e.g., vertical distance) and a change in a horizontal (lateral) distance. For example, the embodiments described herein may determine areas or portions of the reservoir that have largely homogeneous properties in the vertical and lateral directions.

Alternatively or additionally, these embodiments may also determine areas or portions of the reservoir that have largely heterogeneous properties in the vertical and lateral directions. The embodiments described herein determine these properties in part by analyzing changes in fractional flow capacity and fractional storage capacity values from one portion of the reservoir to another portion. Additionally, these embodiments are also configured to generate three-dimensional representations of the determined heterogeneity and homogeneity properties.

Accordingly, based on the three-dimensional representations of the heterogeneity and homogeneity indices, an accurate determination of the composition of the entirety of one or more reservoirs is feasible. Such a determination enables the installation of wells in one or more portions of these reservoirs in configurations and orientations that facilitate the extraction of fluids (e.g., hydrocarbons) in an effective manner.

Figure 1:
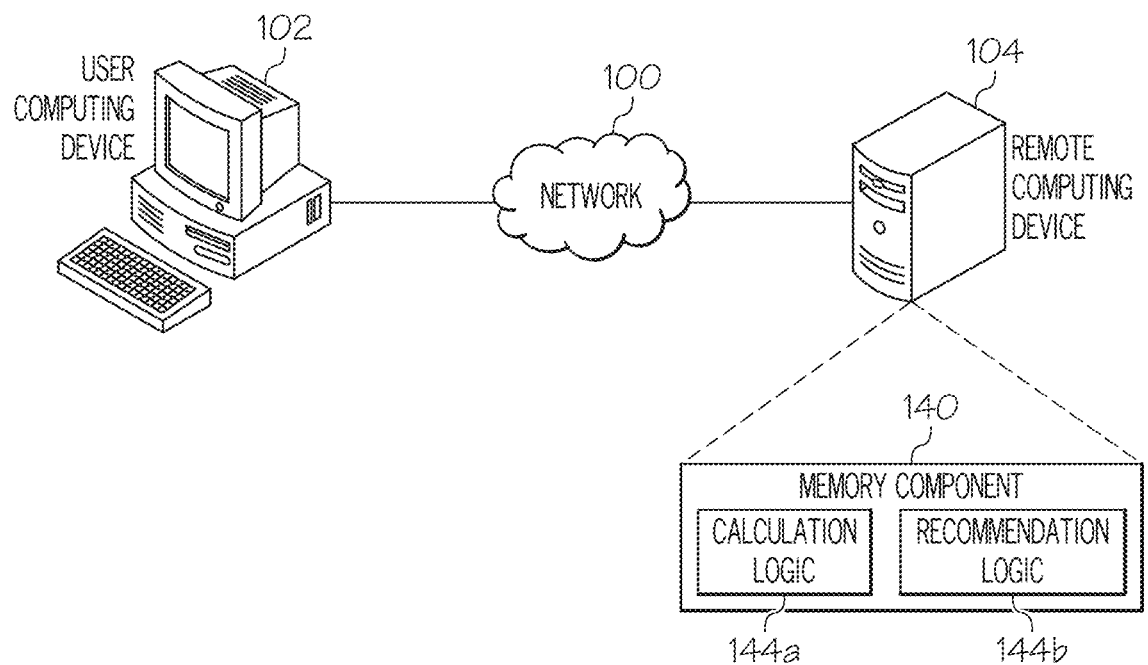
FIG. 1 depicts a computing environment for determining vertical and lateral heterogeneity indices, according to one or more embodiments described herein.

FIG. 1 depicts a computing environment for determining vertical and lateral heterogeneity indices, according to one or more embodiments provided herein. As illustrated, the embodiment of FIG. 1 illustrates a network 100 coupled to a user computing device 102 and a remote computing device 104. The network 100 may include any wide area network (such as the internet, cellular network, mobile data network, WiMAX network, etc.), any local network (such as a local area network, Wi-Fi network, mesh network, etc.), and/or any peer-to-peer network (such as via Bluetooth, ZigBee, etc.). The user computing device 102 may be configured as any personal computer, laptop, mobile device, database, server, etc., for interfacing with a user and thus may include input devices and output devices for facilitating such interface. The remote computing device 104 may include any server, database, personal computer, tablet, mobile device, and/or other device for storing data described and/or performing the calculations described herein.

As depicted in FIG. 1, the remote computing device 104 may include a memory component 140 that is configured to store different types of data, e.g., porosity data, permeability data, etc. The remote computing device 104 may include a memory component 140 that stores calculation logic 144$a$ and recommendation logic 144$b$. As described in more detail below, the calculation logic 144$a$ may be configured for causing a computing device (such as the user computing device 102 and/or the remote computing device 104) to accumulate data, perform the calculations, generate graphical depictions of wells, etc. The recommendation logic 144$b$ may cause a computing device (such as the user computing device 102 and/or the remote computing device 104) to recommend a specific action, initiate generation of models (e.g., geological models), etc. It is noted that, the methods and systems for generating vertical and lateral heterogeneity indices may be implemented using a combination of the user computing device 102 and the remote computing device 104.

A geological model may be generated based, in part, on physical locations of a plurality of wells in a reservoir. The geological model may include graphical representations corresponding to the physical locations of the plurality of wells, namely wells that are currently existing and operational at various physical locations across the reservoir. The geological model may be a static model that includes graphical representations (e.g., a plurality of markers) indicating the physical locations of various currently installed and operational wells in a reservoir. In embodiments, these wells may be, for example, a few miles apart in some cases and several miles apart in other cases. It is noted that the geological model, which is a static model, from which various types of data related to reservoirs and pseudo locations of pseudo wells in these reservoirs may be analyzed using various simulation models.

In embodiments, a reservoir may include a subsurface body of rock or a combination of subsurface rocks having a requisite level of porosity and permeability such that various types of fluids may be stored in and extracted from these rocks. The rocks or rock formations may store hydrocarbons, a combination of hydrocarbons, water, other fluids, etc. The wells may be a combination of one or more structural components that are installed as part of an aperture dug into one or more portions of a reservoir for the purposes of extracting hydrocarbons (and/or other fluids) from the reservoir. The surface level dimensions of the aperture and the depth of the aperture may vary depending on the properties of the reservoir, among other factors.

In embodiments, the geological model based on physical locations of the plurality of wells may include a three-dimensional static model that is built from data that is extracted from and associated with a plurality of existing wells located at various physical locations. The three-dimensional static model may also be built from historical data related to existing operational wells. In other words, the three-dimensional static model is based on production data, operational data, and other such data of currently existing wells, previously operational wells, etc. In the embodiment described herein, depending on the size of the oil field, which may include a plurality of reservoirs (each of which have unique properties), only a small percentage of these reservoirs may have wells that are installed and operational at a given time. As such, in a given field, large tracts of land and large portions of the reservoir may not have any oil wells installed on them.

Identifying the reservoir properties in areas in between these wells enables engineers to better determine which of these areas are suitable for the installation of new wells. To this end, heterogeneity indices of these areas in a reservoir are determined, namely the heterogeneity profile in the vertical direction and lateral directions. Additionally, in embodiments, each currently existing well may include, for example, a plurality of real-time sensors installed at various locations. These sensors may be communicatively coupled (wired or wirelessly) to the remote computing device 104 such that data that is detected by these sensors may be transmitted, in real time, to the remote computing device 104. These sensors may include, e.g., flow meters, water-cut meters, etc. Various other types of meters are also contemplated.

In embodiments, a plurality of locations of pseudo wells (e.g., virtual wells) may be included as part of the generated geological model. These pseudo locations may be shown as additional representations (similar to the representations of the physical locations of the currently existing wells). In embodiments, these pseudo locations may appear as, for example, circles, squares, plus signs, and other such shapes. Alternatively, each circle or square may represent multiple wells. In contrast with the physical locations of the wells, the pseudo locations of the pseudo wells are potential areas that may be selected by (e.g., an engineer) that considers these locations suitable for the construction of oil wells. As such, identifying the reservoir properties in these potential areas is a useful exercise. The manner in which the heterogeneity indices are determined will be discussed in greater detail later on in this disclosure.

In embodiments, reservoir properties associated with pseudo locations of the pseudo wells may be determined. In particular, the reservoir properties relate to porosity, permeability, and thickness associated with portions or zones of the reservoir. Porosity refers to a percentage of pore volume or void space within the reservoir that contains fluids. These void spaces can develop as a result of fractures in the rock, alterations in conditions of the rock over time, and changes in conditions in and around these rocks. Permeability refers to the degree or extent to which the reservoirs allow for or facilitates the flow of fluids. It is noted that reservoir properties include properties in addition to porosity and permeability. It is further noted that these reservoir properties can be identified for a plurality of portions or zones of the reservoirs. Each zone may extend for a certain distance in the vertical direction and the lateral direction and have a distinct thickness, dimension, topology, etc. Moreover, as the geological model is generated, in part, by incorporating the reservoir properties in and around currently existing wells, these reservoir properties are utilized to determine the reservoir properties of the areas in and around the pseudo wells both in the vertical and lateral directions. An example of the manner in which the reservoir may be partitioned is depicted in FIG. 2, described below.

Figure 2:
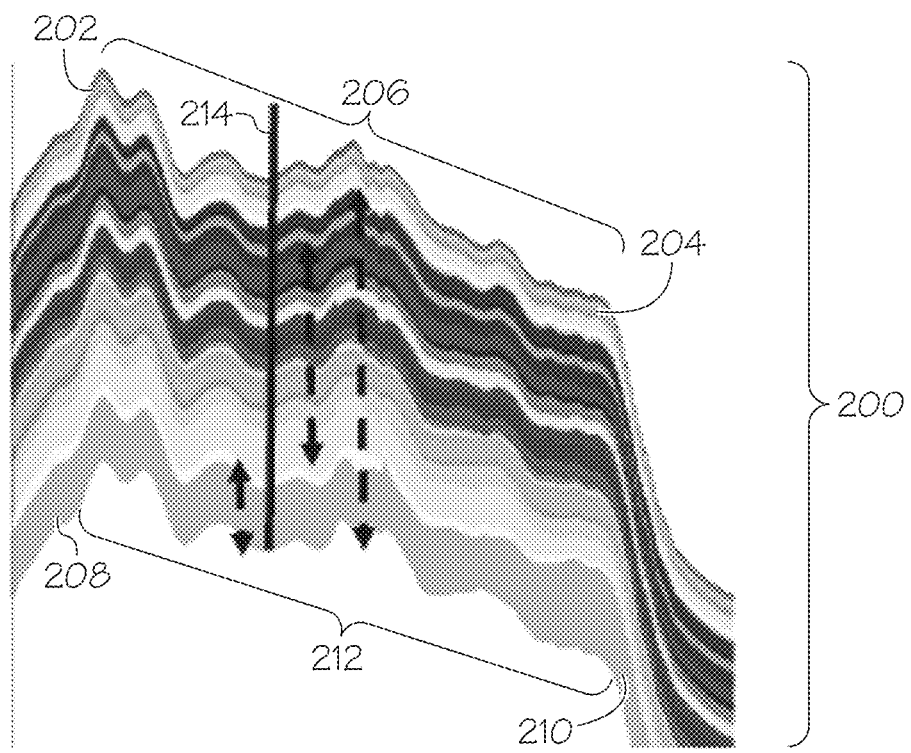
FIG. 2 depicts an exemplary reservoir that is partitioned into various portions or zones, according to one or more embodiments described herein.

FIG. 2 depicts an exemplary reservoir 200 that is partitioned, as depicted in the geological model, into various portions or zones. Each of the portions or zones are depicted with a different pattern that identifies reservoir properties that may be unique to a particular portion or zone (hereinafter the terms "zone" and "portion" of the reservoir may be used interchangeably).

For example, the zone immediately underneath the surface of the exemplary reservoir 200 may be largely homogenous in the lateral direction for a particular distance. In particular, as depicted, the zone 204 underneath the topmost subsurface level 202 may be composed substantially of the same material such that the zone 204 may have substantially similar or the same porosity value and permeability value throughout the lateral range 206. The zone 210 that is above the bottommost subsurface level 208 may also be composed substantially of the same material such that zone 210 may have substantially similar or the same porosity and permeability throughout the lateral range 212. Additionally, a plurality of zones are depicted in between the topmost subsurface level 202 and the bottommost subsurface level 208 such that each zone may have a porosity and permeability value that varies from the immediately adjacent zones. As such, while there is some degree of homogeneity in the horizontal (i.e. lateral direction) in the reservoir depicted in FIG. 2, this reservoir has a significant amount of heterogeneity in the vertical direction. In embodiments, if an exemplary well 214 (e.g., a pseudo well that is indicated by a line extending in the vertical direction) is to be constructed, this well will have to penetrate through largely heterogeneous portions.

In embodiments, reservoir properties for each of the plurality of zones or portions of the reservoir may be determined using the geological model. It is noted that the geological model is generated based on robust historical data of properties of reservoirs, which may have one or more wells installed therein. In embodiments, reservoir properties for a plurality of portions of the reservoir may be determined. These properties are associated with the pseudo locations of the pseudo wells such that these properties describe a plurality of porosity values associated with these pseudo well locations. These porosity values may correspond to a plurality of vertical distances (e.g., intervals) of the reservoir. In other words, a distinct porosity value may correspond with each zone of the plurality of zones as depicted in FIG. 2.

In embodiments, reservoir properties for a plurality of portions of the reservoir that are associated with the pseudo locations of the pseudo wells may be determined. These properties include a plurality of permeability values. These permeability values may correspond to a plurality of vertical distances of the reservoir (e.g., the portions of the reservoir). In other words, a distinct permeability value may correspond with each portion of the plurality of zones as depicted in FIG. 2.

Figure 3A:
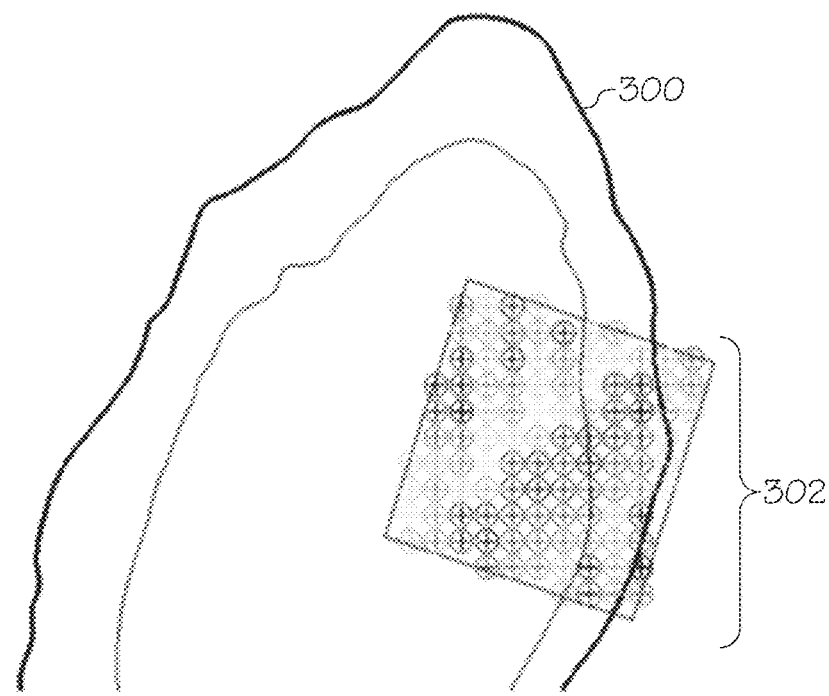
FIG. 3A schematically depicts a plurality of exemplary pseudo locations of pseudo wells in an exemplary reservoir, according to one or more embodiments described herein.

FIG. 3A schematically depicts a plurality of exemplary pseudo locations 302 of pseudo wells in an exemplary reservoir 300 as markers resembling plus signs that are encompassed by circles. These markers may appear as part of the geological model. It is noted that other types of symbols may also be used to depict and identify these pseudo locations. In embodiments, each marker may be indicated with a different color, size, shape, etc., such that the location of the pseudo well corresponding to the marker can be easily identified. Additionally, one or more additional pseudo locations of pseudo wells may be included as part of the geological model by an engineer via, for example, interaction with a software application that is accessible by the remote computing device 104. It is noted that distinct porosity and permeability values may be determined for each exemplary location of the plurality of exemplary pseudo locations 302 of the pseudo wells. Distinct porosity and permeability values may be determined for each zone or portion of the exemplary reservoir 300, which may have a plurality of zones or portions (as depicted in FIG. 2).

In embodiments, heterogeneity indices for each of the pseudo wells associated with, for example, the exemplary pseudo locations 302 may be determined. In particular, vertical heterogeneity indices associated with each location of the pseudo locations of the pseudo wells may be determined. Additionally, lateral heterogeneity indices associated with each location of the pseudo locations of the pseudo wells may be determined using an interpolation operation. In embodiments, the vertical and lateral heterogeneity indices may describe the heterogeneity and/or homogeneity levels associated with each portion or zone of the reservoir (e.g., exemplary reservoir 200, 300). In other words, these indices describe the degree to which composition of a reservoir varies within a certain depth (vertical distance) and a certain horizontal (lateral) distance associated with each portion or zone of the reservoir. The vertical and lateral heterogeneity indices may be determined using Lorenz coefficient calculations.

Specifically, these indices may be determined in a multi-step process. In some embodiments, one or more of these steps may be performed simultaneously. In these embodiments, a storage capacity value and a flow capacity value for each portion or zone of the reservoir may be calculated. These values are calculated using the following equations:

$$\text{Storage Capacity} = (\phi \times H) \tag{1}$$

$$\text{Flow Capacity} = (K \times H) \tag{2}$$

In equation (1), the term "ø" describes a distinct porosity value for a particular zone of the reservoir. While each zone may have a distinct porosity value, it is noted that, depending on the composition of the reservoir, multiple zones may share similar or identical porosity values. The term "H" refers to a distinct thickness of a zone or portion of the reservoir. In embodiments, this thickness may be based on a vertical and/or lateral distance of (e.g., 500 meters-1 kilometer) that may be depicted in the geological model as a representative and proportionally smaller distance. In short, in embodiments, a storage capacity value corresponding to each of the plurality of portions in the reservoir may be determined, using the operation described in equation (1). The determined storage capacity values are associated with the pseudo locations of the pseudo wells.

Additionally, a flow capacity value corresponding to each of the plurality of portions of the reservoir may also be determined. In equation (2), the term "K" describes a distinct permeability value for a particular zone of the reservoir and the term "H" refers to the distinct thickness of a particular zone or portion of the reservoir. A distinct "K" value may be determined for multiple zones or portions of the reservoir. In short, in embodiments, a flow capacity value corresponding to each of the plurality of portions in the reservoir may be determined, using the operation described in equation (2). The determined flow capacity values are also associated with the pseudo locations of the pseudo wells.

Thereafter, an aggregated storage capacity value and an aggregated flow capacity value of the reservoir (e.g., exemplary reservoir 300) may be determined. In embodiments, the aggregated storage capacity value is determined by combining (e.g., via summation) each distinct storage capacity value of each portion of the reservoir (which is determined using equation 1 above). Similarly, the aggregated flow capacity value is determined by combining (e.g., via summation) each distinct flow capacity value of each portion of the reservoir (which is determined using equation 2 above). It is noted that, in embodiments, calculations for thousands of portions in one or more reservoirs, e.g., at locations across a vast geographic surface and subsurface area, may be performed. In embodiments, these calculations or determinations may be performed in real time. Alternatively or additionally, the aggregated storage capacity and flow capacity values may also be weighted or modified according to one or more factors.

In embodiments, a fractional storage capacity value associated with each of the plurality of portions in the reservoir associated a plurality of pseudo locations of which the pseudo wells may be performed. This fractional storage capacity value may be determined by performing an operation using each storage capacity value and the aggregated storage capacity value. In particular, a distinct fractional storage capacity value may be determined for each portion of the reservoir by performing the following operation:

$$\text{Fractional Storage Capacity Value} = \frac{(\phi \times H)}{\text{Aggregated Storage Capacity Value}} \tag{3}$$

It is also noted that a plurality of portions of the reservoir may share a substantially similar fractional storage capacity value. In some embodiments, for at least one portion of the plurality of portions in the reservoir, a distinct fractional storage capacity may be determined. This distinct fractional storage capacity may be determined by dividing each storage capacity value corresponding to each portion of the plurality of portions in the reservoir by the aggregated storage capacity value. In embodiments, this operation may be performed by the remote computing device 104 automatically and in real time (e.g., without user intervention).

A fractional flow capacity value associated with each of the plurality of portions in the reservoir may also be determined. These fractional flow capacity values may be determined by performing an operation using each flow capacity value and the aggregated flow capacity value. In particular, a distinct fractional flow capacity value may be determined for each portion of the reservoir by performing the following operation:

$$\text{Fractional Flow Capacity Value} = \frac{(\phi \times K)}{\text{Aggregated Flow Capacity Value}} \tag{4}$$

It is also noted that two or more portions of the reservoir may share a substantially similar flow storage capacity value in some cases. In embodiments, for at least one portion of the plurality of portions in the reservoir, a distinct flow capacity value may be determined, e.g., by dividing each determined flow capacity value corresponding to each portion of the plurality of portions in the reservoir by the aggregated flow capacity value. In embodiments, the remote computing device 104 may perform this operation automatically and in real time (e.g., without user intervention).

A aggregated fractional storage capacity value and an aggregated fractional flow capacity value of the reservoir may also be determined. In embodiments, the aggregated fractional storage capacity value is determined by combining (e.g., via summation) each distinct fractional storage capacity value of each portion of the reservoir (which is determined using equation 3 above). Similarly, the aggregated fractional flow capacity value is determined by combining (e.g., via summation) each distinct flow capacity value of each portion of the reservoir (which is determined using equation 4 above). It is noted that, in embodiments, these calculations may be performed for thousands of portions in one or more reservoirs at locations across a vast geographic surface and subsurface area. Additionally, in embodiments, these calculations or determinations may be performed in real time. In embodiments, upon determining the aggregated fractional storage capacity value and the aggregated fractional flow capacity value, a graphical representation that tracks the aggregated fractional storage capacity and flow capacity values may be generated, as depicted in FIG. 3B.

Figure 3B:
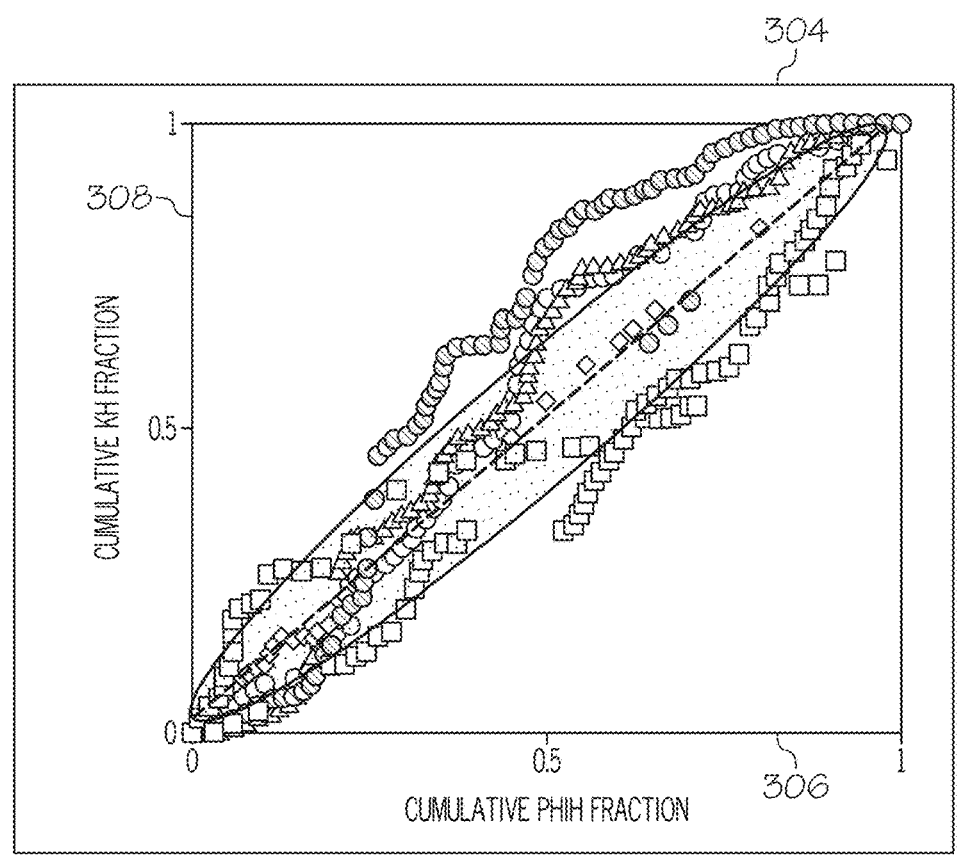
FIG. 3B schematically depicts a graphical representation of the fractional storage capacity values and the fractional flow capacity values, according to one or more embodiments described herein.

FIG. 3B schematically depicts a graphical representation 304 of the fractional storage capacity values on the x-axis 306 and the fractional flow capacity values on the y-axis 308.

In particular, each fractional storage capacity value associated with each of the plurality of portions in the reservoir may included on the x-axis 306 and each fractional flow capacity value associated with each of the plurality of portions in the reservoir maybe be included on the y-axis 308. It is noted that the fractional storage capacity values and fractional flow capacity values may be plotted based on the vertical depth levels.

In embodiments, the graphical representation may be analyzed to determine vertical heterogeneity indices associated with the plurality of portions in the reservoir. In embodiments, the analysis may involve determining a relationship between a fractional storage capacity value and a fractional flow capacity value, both of which relate to the same portion. In particular, a change of each fractional flow capacity value may be determined based on a variation in a corresponding fractional storage capacity value, wherein the fractional flow capacity value and the corresponding fractional storage capacity value are associated with the same portion of the plurality of portions of the reservoir. In other words, in reference to FIG. 3B, for a first fractional storage capacity value of 0.3 and a second storage capacity value of 0.5 (on the x-axis 306), the corresponding flow capacity values are approximately 0.3 and 0.5 (on the y-axis 308) may be determined. Based on this information, it may be determined that the heterogeneity indices for the two portions (having the storage capacity values of 0.3 and 0.5) is relatively low, meaning that these portions or zones are largely homogeneous.

It may be determined that these portions are homogeneous because the change in the fractional flow capacity is similar or comparable to the change in the fractional storage capacity. Specifically, the data indicates a largely linear distribution. If the change in the fractional flow capacity is disproportionately high or disproportionately low relative to the change in the fractional storage capacity for any two or more portions of the reservoir, it may be determined that the heterogeneity indices for these portions are high. Specifically, these portions or zones are largely heterogeneous. In embodiments, a distinct vertical heterogeneity value for each portion of the plurality of portions in the reservoir may be determined by comparing a fractional storage capacity value and the fractional flow capacity value with a comparable value on the dotted line (as depicted in FIG. 3B), which extends in a substantially diagonal direction (at approximately a 45° angle) from coordinate point (0,0) to coordinate point (1,1). The dotted lines are indicative of a uniform and homogenous distribution of values, as a fractional storage capacity value has a corresponding and substantially similar fractional flow capacity value.

Consequently, a difference between a coordinate value (e.g., coordinate values of (0.3, 0.5)) that includes a fractional storage capacity value of a portion in the reservoir and a corresponding fractional flow capacity value of the same portion and the point closest to this value on the dotted line (e.g., coordinate values of (0.4 and 0.4)) is the vertical heterogeneity value of that portion of the reservoir. In this way, a plurality of vertical heterogeneity values are determined for the pseudo locations of the pseudo wells, namely the plurality of portions in the reservoir associated the pseudo wells.

From this, a plurality of lateral heterogeneity indices, or values that correspond to areas that extend horizontally from the pseudo wells, may be calculated. For example, a pseudo well may be located at a particular location in the reservoir and another pseudo well may be located a few kilometers away. Upon determination of the vertical heterogeneity indices, lateral heterogeneity indices associated with these areas may also be determined, for example, using an interpolation operation that is based on the vertical heterogeneity indices.

In embodiments, a determination may be made that the area in and around a certain threshold distance of a particular portion of the reservoir (e.g., the threshold distance may be a predetermined radial distance from the portion) may have a lateral heterogeneity index that is substantially similar to the vertical heterogeneity index of this portion. Such interpolation operations may be performed, automatically and without user intervention, for each portion of the plurality of portions in the reservoir, and repeated for multiple reservoirs that are included in the geological model (e.g., a static three-dimensional model). In this way, comprehensive lateral heterogeneity indices may be determined for each location of the pseudo locations of the pseudo wells, namely the plurality of portions in the reservoir that are associated with these pseudo wells.

In practice, the heterogeneity indices may be used to effectively determine areas in the reservoir that are best suited for the installation of wells. In embodiments, these areas may be automatically identified, by generating a three dimensional heterogeneity property model based on vertical heterogeneity indices and the lateral heterogeneity indices, as described above.

Figure 4A:
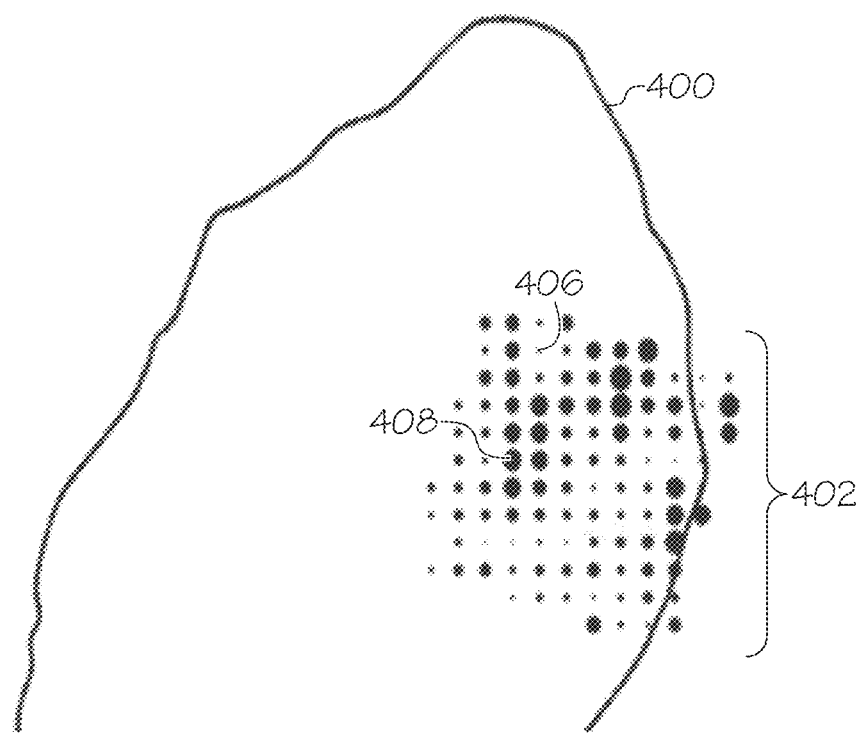
FIG. 4A schematically depicts a two-dimensional heterogeneity property model of an exemplary reservoir in which each portion of a plurality of portions in the reservoir is indicated by a cluster of circular markers, according to one or more embodiments described herein.

FIG. 4A schematically depicts a two-dimensional heterogeneity property model of an exemplary reservoir 400 in which each portion of a plurality of portions in the reservoir is indicated by a cluster 402 of circular markers. As depicted, a small circular marker 406 may be representative of a portion in the reservoir that is substantially homogenous, and as such, the heterogeneity index for the portion is low. In some embodiments, a larger circular marker 408 may be representative of a different portion in the reservoir that is substantially heterogeneous, and as such, the heterogeneity index for this different portion is high.

Figure 4B:
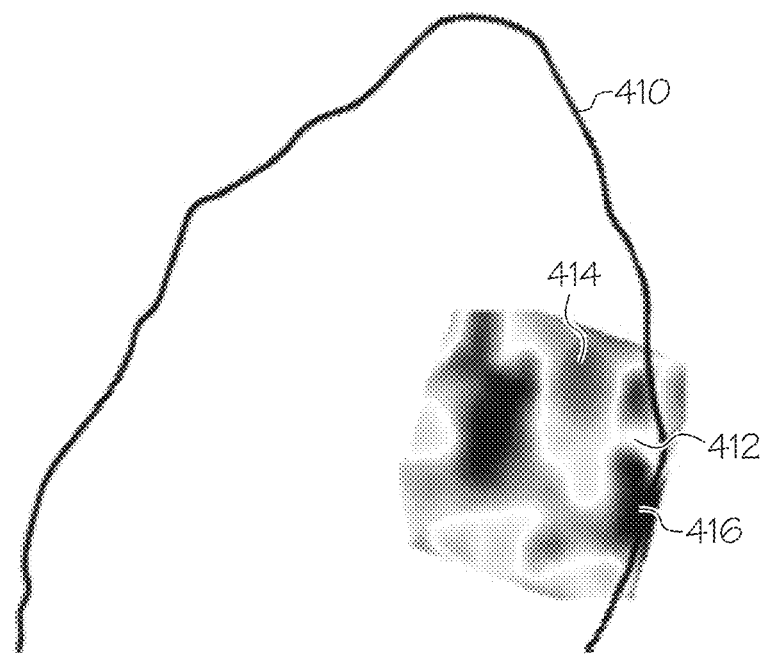
FIG. 4B schematically depicts a two-dimensional heterogeneity property model of an exemplary reservoir in which various portions in the exemplary reservoir are indicated with different patterns corresponding to varying heterogeneity indices or compositions, according to one or more embodiments described herein.

FIG. 4B schematically depicts a two-dimensional heterogeneity property model of an exemplary reservoir 410 in which various portions in the exemplary reservoir 410 are indicated with different patterns corresponding to varying heterogeneity indices or compositions, according to one or more embodiments described herein. In embodiments, the portions indicated by the pattern 412 of the exemplary reservoir 410 are indicative of largely homogeneous areas, and as such, these areas have heterogeneity indices that are very low. If oil wells are installed in the portions indicated by the pattern 412, the likelihood of extracting fluids in a uniform and consistent manner is high regardless of the areas in the portions indicated by the pattern 412 where these wells are installed. The portions indicated by the patterns 414 of the exemplary reservoir 410 are portions in which the likelihood of extracting fluid in a uniform and consistent manner is highest if the wells are installed in the topmost areas of these portions. In contrast, the portions indicated by the pattern 416 of the exemplary reservoir 410 are portions in which the likelihood of extracting fluid in a uniform and consistent manner is highest if the wells are installed in the bottommost areas of these portions.

Figure 5A:
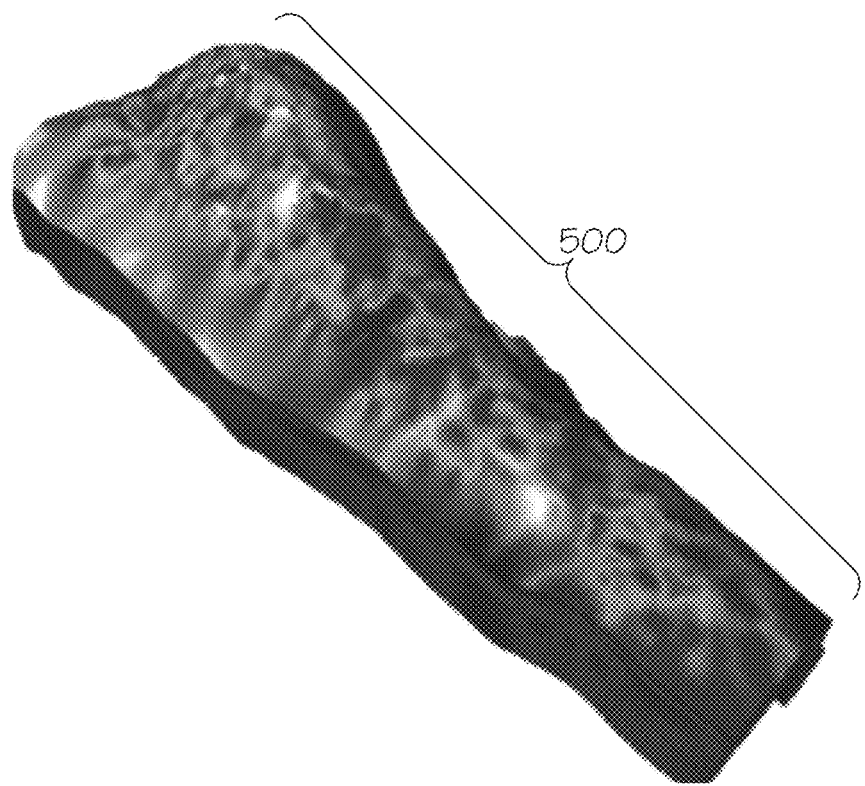
FIG. 5A schematically depicts a three-dimensional heterogeneity property model of an exemplary reservoir in which various zones are indicated with different patterns with each pattern having a particular heterogeneity index or characteristic, according to one or more embodiments described herein.

FIG. 5A schematically depicts a three-dimensional heterogeneity property model of an exemplary reservoir 500 in which various zones are indicated with different patterns or shadings. In particular, the three-dimensional nature of this model enables engineers to analyze the contours and topology of the exemplary reservoir 500 such that identifying the areas in which the well is to be installed. Moreover, varying heterogeneity indices or characteristics are indicated such that each pattern or shading may correspond with a particular heterogeneity index or characteristic. The three-dimensional heterogeneity property model also enables the determination of portions of the reservoir in which the uniform and consistent fluid extraction is more easily discernable.

Figure 5B:
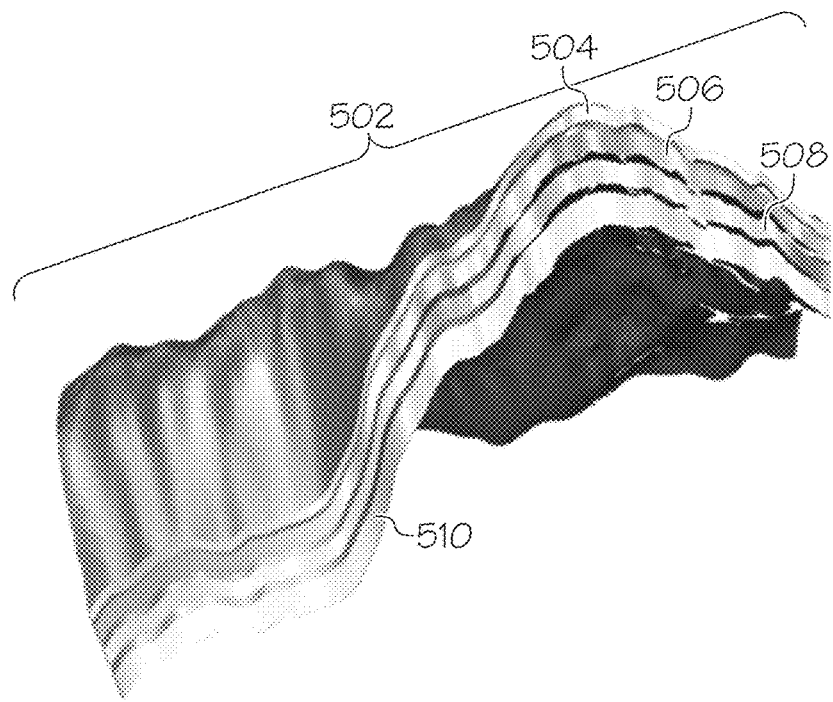
FIG. 5B schematically depicts a side view of a three-dimensional heterogeneity property model of a reservoir in which the portions or zones of the exemplary reservoir are shown with different patterns such that each pattern corresponds to a particular heterogeneity index or characteristic, according to one or more embodiments described herein.

FIG. 5B schematically depicts a side view of a three-dimensional heterogeneity property model of an exemplary reservoir 502 in which the portions or zones of the exemplary reservoir are shown with different patterns such that each pattern corresponds to a particular heterogeneity index or characteristic, according to one or more embodiments described herein. In particular, this model shows portions 504, 506, 508, 510, each of which has a specific topology and varying vertical and lateral heterogeneity indices. Such a model may enable the effective determination of the locations in which wells may be installed in order to facilitate uniform and consistent extraction of fluids.

Figure 6:
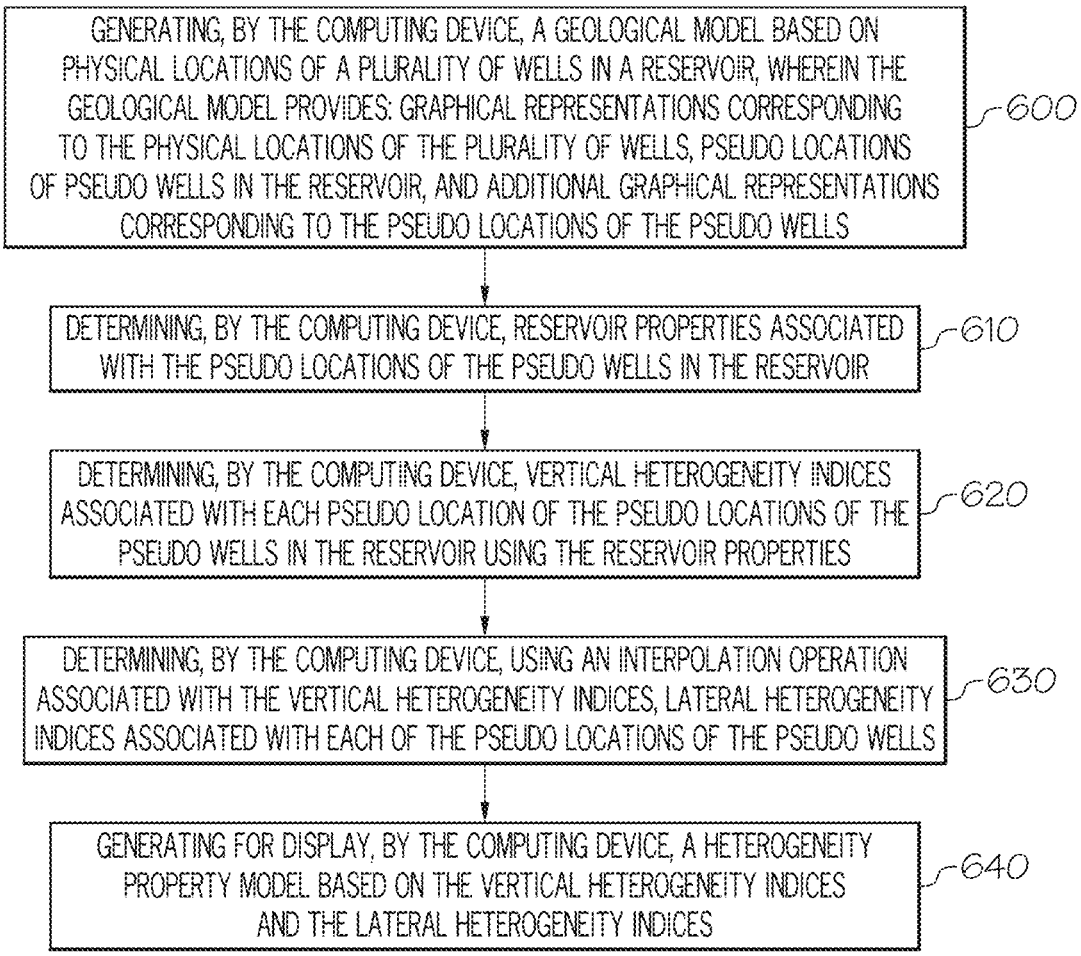
FIG. 6 depicts a flowchart of a method for generating vertical and lateral heterogeneity indices, according to one or more embodiments shown and described herein.

FIG. 6 depicts a flowchart of a method for generating vertical and lateral heterogeneity indices, according to one or more embodiments shown and described herein. In block 600, a geological model may be generated based, at least in part, on physical locations of a plurality of wells in a reservoir, the geological model including graphical representations corresponding to the physical locations of the plurality of wells. As previously stated, these graphical representations may be two-dimensional or three-dimensional models. In embodiments, these representations may include, e.g., a plurality of markers or symbols of various shapes that may be placed at various locations of these models. Each marker or symbol may correspond with a particular location in which a well (or cluster of wells) is situated. In embodiments, these models may be updated in real time upon the addition or inclusion of wells. As previously stated, the geological model may be a three-dimensional model that is based on historical data related to various existing or previously operational wells.

Additionally, a plurality of pseudo locations of pseudo wells in the reservoir may be included as part of the geological model. The geological model may include additional representations corresponding to pseudo locations of the pseudo wells. The pseudo-well locations, similar to the physical locations of currently operational wells, may be various markers or symbols that are displayed on, e.g., a user interface that is displayed on a display connected to the remote computing device 104.

In block 610, reservoir properties associated with the pseudo locations of the pseudo wells in the reservoir may be determined. The reservoir properties may relate to porosity, permeability, and thickness associated with portions of zones of a reservoir that is associated with the pseudo wells (e.g., block 610), Specifically, as depicted in FIG. 2, each reservoir may be depicted as including various zones or partitions, each of which may have a particular composition. In FIG. 2, the zone 204 underneath the topmost subsurface level 202 may be composed substantially of the same material such that this zone may be substantially similar to or have the same porosity value and permeability value throughout the lateral range 206. The zone 210 that is above the lowest subsurface level 208 may also be composed substantially of the same material such that 210 may have substantially similar or the same porosity and permeability throughout the lateral range 212. Additionally, a plurality of zones are depicted in between the topmost subsurface level 202 and the bottommost subsurface level 208 such that each zone may have a porosity and permeability value that varies from the immediately adjacent zones. As such, while there is some degree of homogeneity in the horizontal (i.e. lateral) direction in the reservoir depicted in FIG. 2, this reservoir has a significant amount of heterogeneity in the vertical direction.

In block 620, vertical heterogeneity indices associated with each location of the pseudo locations of the pseudo wells in one or more reservoirs may be determined. A composition of a reservoir (e.g., as depicted in FIG. 2) may vary significantly. As stated above, vertical heterogeneity indices may be determined by analyzing the relationship between fractional storage capacity values and fractional flow capacity values (e.g., FIG. 3B). Specifically, a change of a particular fractional flow capacity value based on a variation in a corresponding fractional storage capacity value may be determined, wherein the fractional flow capacity value and the corresponding fractional storage capacity value are associated with the same portion of the plurality of portions of the reservoir. If the changes are few, the vertical heterogeneity of the reservoir may be low (e.g., the reservoir may be homogeneous). In contrast, larger variances indicate a higher vertical heterogeneity.

In block 630, lateral heterogeneity indices associated with each location of the pseudo locations of the pseudo wells may be determined using an interpolation operation that may be performed in association with the vertical heterogeneity indices. Using the vertical heterogeneity indices, lateral heterogeneity indices or values that correspond to areas that extend horizontally from the pseudo wells may be determined. For example, a pseudo well may be located at a particular location in the reservoir and another pseudo well may be located a few kilometers away. Upon determination of the vertical heterogeneity indices, the lateral heterogeneity indices (e.g., variations in the reservoir formation between the two pseudo well locations) may be determined by performing an interpolation operation using the vertical heterogeneity indices.

In block 640, a heterogeneity property model (as depicted in FIGS. 4A and 4B) may be generated based on the determined vertical and lateral heterogeneity indices. As depicted, these FIGS. provide a depiction of the vertical and lateral heterogeneity compositions of portions of the rocks. Specifically, as shown in FIG. 4B, the portions indicated by the pattern 412 of the exemplary reservoir 410 are indicative of largely homogeneous areas, and as such, these areas have heterogeneity indices that are very low. If oil wells are installed in one or more areas of the portions indicated by the pattern 412, the likelihood of extracting fluids in a uniform and consistent manner is high regardless of the areas where these wells are installed. The portions indicated by the patterns 414 of the exemplary reservoir 410 are portions in which the likelihood of extracting fluid in a uniform and consistent manner is highest if the wells are installed in the topmost areas of these portions. In contrast, the portions indicated by the pattern 416 of the exemplary reservoir 410 are portions in which the likelihood of extracting fluid in a uniform and consistent manner is highest if the wells are installed in the bottommost areas of these portions. Other exemplary heterogeneity models are depicted in FIGS. 5A and 5B.

Figure 7:
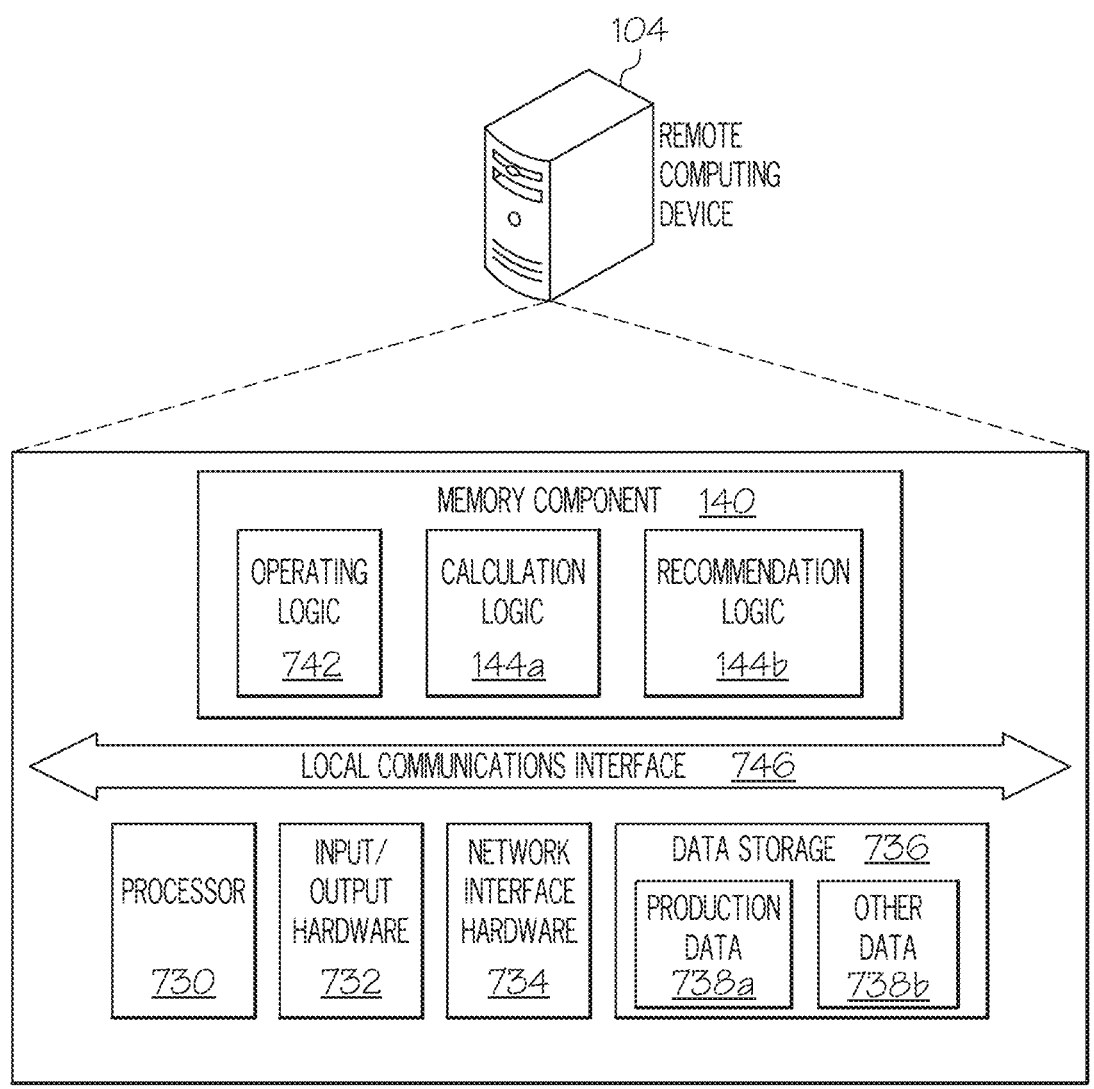
FIG. 7 depicts a remote computing device for generating vertical and lateral heterogeneity indices, according to one or more embodiments described herein.

FIG. 7 depicts the remote computing device 104 (as depicted in FIG. 1) for generating vertical and lateral heterogeneity indices for reservoirs, according to embodiments provided herein. As illustrated, the remote computing device 104 includes a processor 730, input/output hardware 732, a network interface hardware 734, a data storage component 736 (which stores production data 738a and/or other data 738b as described with reference to FIGS. 2-5B), and a memory component 140. The memory component 140 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD) (whether local or cloud-based), and/or other types of non-transitory computer-readable medium. Depending on the particular embodiment, these non-transitory computer-readable mediums may reside within the remote computing device 104 and/or external to the remote computing device 104.

The memory component 140 may store operating logic 742, the calculation logic 144a, and the recommendation logic 144b. Each of these logic components may include a plurality of different pieces of logic, each of which may be embodied as a computer program, firmware, and/or hardware, as an example. A local interface 746 is also included in FIG. 7 and may be implemented as a bus or other communication interface to facilitate communication among the components of the remote computing device 104.

The processor 730 may include any processing component operable to receive and execute instructions (such as from a data storage component 736 and/or the memory component 140). As described above, the input/output hardware 732 may include and/or be configured to interface with speakers, microphones, and/or other input/output components.

The network interface hardware 734 may include and/or be configured for communicating with any wired or wireless networking hardware, including an antenna, a modem, a LAN port, wireless fidelity (Wi-Fi) card, WiMAX card, mobile communications hardware, and/or other hardware for communicating with other networks and/or devices. From this connection, communication may be facilitated between the remote computing device 104 and other computing devices.

The operating logic 742 may include an operating system and/or other software for managing components of the remote computing device 104. As discussed above, the calculation logic 144a may reside in the memory component 140 and may be configured to cause the processor 730 to perform various calculations, recommend a specific action, initiate the generation of models (e.g., geological models, vertical and lateral heterogeneity models, etc.), as described herein. The recommendation logic 144b may be configured to cause the processor 730 to generate vertical and lateral heterogeneity indices.

It should be understood that while the components in FIG. 7 are illustrated as residing within the remote computing device 104, this is merely an example. In some embodiments, one or more of the components may reside external to the remote computing device 104 or within other devices, such as the user computing device 102 depicted in FIG. 1. It should also be understood that, while the remote computing device 104 is illustrated as a single device, this is also merely an example. In some embodiments, the calculation logic 144a and the recommendation logic 144b may reside on different computing devices.

As an example, one or more of the functionalities and/or components described herein may be provided by the remote computing device 104 and/or the user computing device 102. Depending on the particular embodiment, any of these devices may have similar components as those depicted in FIG. 7. To this end, any of these devices may include logic for performing the functionality described herein.

Additionally, while the remote computing device 104 is illustrated with the calculation logic 144a and the recommendation logic 144b as separate logical components, this is also an example. In some embodiments, a single piece of logic may provide the described functionality. It should also be understood that while the calculation logic 144a and the recommendation logic 144b are described herein as the logical components, this is also an example. Other components may also be included, depending on the embodiment.

It should now be understood that certain embodiments described herein are directed to a method of generating heterogeneity indices for one or more reservoirs. The method includes generating, by a computing device, a geological model based on physical locations of a plurality of wells in a reservoir, wherein the geological model provides: graphical representations corresponding to the physical locations of the plurality of wells, a plurality of pseudo locations of pseudo wells in the reservoir, and representations corresponding to pseudo locations of the pseudo wells, determining, by the computing device, reservoir properties associated with the pseudo locations of the pseudo wells in the reservoir, determining, by the computing device, vertical heterogeneity indices associated with each pseudo location of the pseudo locations of the pseudo wells in the reservoir, determining, by the computing device, using an interpolation operation associated with the vertical heterogeneity indices, lateral heterogeneity indices associated with each pseudo location of the pseudo locations of the pseudo wells, and generating for display, by the computing device, a heterogeneity property model based on the vertical heterogeneity indices and the lateral heterogeneity indices.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method implemented by a computing device, the method comprising:
   generating, by the computing device, a geological model based on physical locations of a plurality of wells in a reservoir, wherein the geological model provides: graphical representations corresponding to the physical locations of the plurality of wells, pseudo locations of pseudo wells in the reservoir, and additional graphical representations corresponding to the pseudo locations of the pseudo wells;
   determining, by the computing device, reservoir properties associated with the pseudo locations of the pseudo wells in the reservoir;
   determining, by the computing device, vertical heterogeneity indices associated with each pseudo location of the pseudo locations of the pseudo wells in the reservoir using the reservoir properties, wherein determining the vertical heterogeneity indices associated with the pseudo locations of the pseudo wells in the reservoir includes analyzing the graphical representations, automatically and without user intervention, to determine a change in fractional flow capacity values in a plurality of portions of the reservoir based on a variation in a corresponding one of the fractional storage capacity values, wherein each of the fractional flow capacity values and the corresponding ones of the fractional storage capacity values are associated with the same portion of the plurality of portions;
   determining, by the computing device, using an interpolation operation associated with the vertical heterogeneity indices, lateral heterogeneity indices associated with each of the pseudo locations of the pseudo wells; and
   generating for display, by the computing device, a heterogeneity property model based on the vertical heterogeneity indices and the lateral heterogeneity indices.

2. The method of claim 1, wherein the reservoir properties associated with the pseudo locations of the pseudo wells in the reservoir describe a plurality of porosity values, and wherein the plurality of porosity values corresponds to a plurality of vertical distances of the reservoir.

3. The method of claim 1, wherein the reservoir properties associated with the pseudo locations of the pseudo wells in the reservoir describe a plurality of permeability values.

4. The method of claim 3, wherein the plurality of permeability values corresponds to a plurality of vertical distances of the reservoir.

5. The method of claim 1, further comprising determining, using the reservoir properties that includes a plurality of porosity values and a plurality of permeability values, storage capacity values and flow capacity values, the storage capacity values and the flow capacity values being based on Lorenz coefficients.

6. The method of claim 5, wherein determining the storage capacity values and the flow capacity values includes determining a storage capacity value associated with each of a plurality of portions in the reservoir, the plurality of portions being associated the pseudo wells.

7. The method of claim 6, further comprising determining a flow capacity value associated with each of the plurality of portions.

8. The method of claim 7, further comprising determining, by combining the storage capacity values, an aggregated storage capacity value.

9. The method of claim 8, further comprising determining, by combining the flow capacity values, an aggregated flow capacity value.

10. The method of claim 9, further comprising determining a fractional storage capacity value associated with each of the plurality of portions by performing an operation using each storage capacity value and the aggregated storage capacity value.

11. The method of claim 10, further comprising determining a fractional flow capacity value associated with each of the plurality of portions in the reservoir by performing an additional operation using each of the flow capacity values and the aggregated flow capacity value.

12. The method of claim 11, further comprising determining, by combining the fractional storage capacity values, an aggregated fractional storage capacity value.

13. The method of claim 12, further comprising determining, by combining the fractional flow capacity values, an aggregated fractional flow capacity value.

14. The method of claim 13, further comprising generating a graphical representation using the aggregated storage capacity value and the aggregated flow capacity value.

15. A system comprising:
   a processor; and
   a memory component that stores logic that, when executed by the processor, causes the system to perform at least the following:
      generate a geological model based on physical locations of a plurality of wells in a reservoir, the geological model providing the following: graphical representations corresponding to the physical locations of the plurality of wells; pseudo locations of pseudo wells in the reservoir, and additional graphical representations corresponding to the pseudo locations of the pseudo wells;
      determine reservoir properties associated with the pseudo locations of the pseudo wells in the reservoir;
      determine vertical heterogeneity indices associated with each pseudo location of the pseudo locations of the pseudo wells in the reservoir, using the reservoir properties, wherein determining the vertical heterogeneity indices associated with the pseudo locations of the pseudo wells in the reservoir includes analyzing the graphical representations, automatically and without user intervention, to determine a change in fractional flow capacity values in a plurality of portions of the reservoir based on a variation in a corresponding one of the fractional storage capacity values, wherein each of the fractional flow capacity values and the corresponding ones of the fractional storage capacity values are associated with the same portion of the plurality of portions;

determine, using an interpolation operation associated with the vertical heterogeneity indices, lateral heterogeneity indices associated with each of the pseudo locations of the pseudo wells; and provide at least a portion of the vertical heterogeneity indices and the lateral heterogeneity indices for display.

16. A non-transitory computer-readable medium that stores logic that, when executed by a computing device, causes the computing device to:

generate a geological model based on physical locations of a plurality of wells in a reservoir, the geological model providing at least one of the following: graphical representations corresponding to the physical locations of the plurality of wells, pseudo locations of pseudo wells in the reservoir, and additional graphical representations corresponding to the pseudo locations of the pseudo wells;

determine reservoir properties associated with the pseudo locations of the pseudo wells in the reservoir;

determine vertical heterogeneity indices associated with each pseudo location of the pseudo locations of the pseudo wells in the reservoir, wherein determining the vertical heterogeneity indices associated with the pseudo locations of the pseudo wells in the reservoir includes analyzing the graphical representations, automatically and without user intervention, to determine a change in fractional flow capacity values in a plurality of portions of the reservoir based on a variation in a corresponding one of the fractional storage capacity values, wherein each of the fractional flow capacity values and the corresponding ones of the fractional storage capacity values are associated with the same portion of the plurality of portions;

determine, using an interpolation operation associated with the vertical heterogeneity indices, lateral heterogeneity indices associated with each of the pseudo locations of the pseudo wells;

generate a heterogeneity property model based on the vertical heterogeneity indices and the lateral heterogeneity indices; and provide at least one of the following for display: at least one of the vertical heterogeneity indices or at least one of the lateral heterogeneity indices.

17. The non-transitory computer-readable medium of claim 16, wherein the reservoir properties corresponding to the pseudo locations of the pseudo wells in the reservoir include a plurality of porosity values and a plurality of permeability values.

* * * * *